United States Patent [19]

Fahrenholtz et al.

[11] 4,173,470

[45] Nov. 6, 1979

[54] NOVOLAK PHOTORESIST COMPOSITION AND PREPARATION THEREOF

[75] Inventors: Susan Fahrenholtz, Bloomfield, N.J.; David T. Long, Orefield; Raymond C. Pitetti, Wescosville, both of Pa.

[73] Assignee: Bell Telephone Laboratories, Incorporated, Murray Hill, N.J.

[21] Appl. No.: 849,754

[22] Filed: Nov. 9, 1977

[51] Int. Cl.$^2$ .......................... G03C 1/68; G03C 5/00; G03C 1/52; A47G 27/04

[52] U.S. Cl. .......................................... 430/5; 528/125; 528/493; 528/155; 430/319; 430/306; 430/313; 430/165; 430/189; 430/270

[58] Field of Search ................... 96/115 R, 35, 91 D, 96/36, 36.2; 528/493; 260/57 R, 55

[56] References Cited

U.S. PATENT DOCUMENTS

| | | | |
|---|---|---|---|
| 3,687,896 | 8/1972 | Vargiu et al. | 260/57 A |
| 3,827,908 | 8/1974 | Johnston et al. | 96/115 R |
| 3,868,254 | 2/1975 | Wemmers | 96/115 R |
| 4,115,128 | 9/1978 | Kita | 96/115 R |

OTHER PUBLICATIONS

Kice and Marvell, *Modern Principles of Organic Chemistry*, The MacMillan Co., N.Y. C1965, pp. 306–307.

*Primary Examiner*—Richard L. Schilling
*Attorney, Agent, or Firm*—Edward M. Fink; Peter V. D. Wilde

[57] ABSTRACT

A novolak resin suitable for use as a light-sensitive photoresist or maskant is prepared by reaction of at least one cresol with an aldehyde or reactive ketone and an aromatic hydroxyl compound having an alkyl side chain of from 3–15 carbon atoms. The addition of a conventional photosensitive agent yields a composition evidencing superior characteristics as compared with prior art novolak photoresists and which requires less sensitizer than such prior art resists.

8 Claims, No Drawings

NOVOLAK PHOTORESIST COMPOSITION AND PREPARATION THEREOF

This invention relates to a technique for the generation of a patterned relief image and to a composition suitable for use as a photosensitive maskant or photoresist. More particularly, the present invention relates to a novolak composition which may be used as a photoresist or a photomask, and in which a patterned relief image may be generated.

Heretofore, novolak resins have been widely used in positive photoresist compositions. Their suitability for such applications has been premised upon their marginal base solubility and resistance to acids and etchants commonly encountered in resist processing. Although the novolak containing resists have enjoyed commercial success, workers in the art have continuously focused their interest upon the development of additives capable of enhancing the resists. Thus, for example, adhesion to metal surfaces and enhancement of resistance to alkaline solutions have been areas to which their interest has been addressed. Consequently, the resultant resist compositions are oftentimes complex mixtures whose properties vary significantly and typically adversely affect development procedures.

In accordance with the present invention, a technique is described for the preparation of a novolak resin and its incorporation into a photosensitive composition. The novolak prepared as described incorporates a hydrophobic chain on a portion of the phenyl ring of the resin. This hydrophobic chain is found to enhance the adhesion of the resin upon certain surfaces and to increase resist sensitivity while maintaining excellent edge profiles and resolution as compared with known novolak photoresists of comparable molecular weight. Additionally, the described resist includes less sensitizer than is normally employed for such purposes while maintaining characteristics which can be used with concentrated basic developers. Still further the novolaks herein are found to be more compatible with non-polar compounds than are the conventional cresol novolaks.

The photoresists herein include novolak resins which are characterized as having a weight average molecular weight of from 2000 to 15,000 relative to polystyrene standard (gel permeation chromotography), at least two aryl moieties per molecule, the aryl nucleus of each aryl moiety containing from 6–10 carbon atoms, at least one divalent bridging moiety and at least two hydroxyl groups per molecule, each group being directly attached to a different one of said aryl nuclei.

These resins may conveniently be prepared by reacting an aromatic hyroxyl compound having a hydrophobic chain with at least one cresol and a condensation agent including at least one carbonyl group in the presence of a catalyst.

The aromatic hydroxyl compound containing a hydrophobic chain is of the general formula

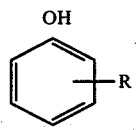

wherein R is an alkyl group having from 3 to 15 carbon atoms, the compound being employed in an amount ranging from 5–50% by weight, based on the total aromatic hydroxyl containing compounds present in the composition. A particularly useful compound for this purpose is 2-tertiary butyl phenol.

The cresols employed herein may be selected from among the ortho, meta and para derivatives thereof and may be employed in an amount ranging from 50–95 percent, by weight, based on the total aromatic hydroxyl containing compounds present in the composition.

The condensation agent chosen for use herein is selected from among aldehydes and reactive ketones having less than 10 carbon atoms and at least one carbonyl group per molecule. Compounds suitable for this purpose include formaldehyde, acetaldehyde, propionaldehyde and the like, a general preference being found for formaldehyde. The condensation agent is employed in amounts ranging from 0.95 to 1.35 of the stoichiometric amount.

The catalysts chosen for use in effecting the condensation reaction herein may be selected from among the mineral acids or organic carboxylic acids. Typical catalysts for this purpose are oxalic acid, hydrochloric acid, p-toluene sulfonic acid, and the like. Basic catalysts such as sodium hydroxide may also be used. The amount of catalyst employed may range from 0.5 to 5 percent, by weight, based upon the weight of the total aromatic compounds present in the composition.

A general description of the preparative technique follows:

Condensation of the foregoing reactants may be effected in any conventional condensation apparatus, a reactor equipped with an agitator, means for reflux and distillation, and conventional heat-transfer means being found suitable therefor. In general, a preferred method for carrying out the condensation reaction of the cresol, condensation agent and hydroxylated aromatic is to add the condensation agent to a mixture of cresol and hydroxylated aromatic containing the acid catalyst. The resultant mixture is agitated and heated to reflux over a time period ranging from 12 to 24 hours during which the hydroxylated aromatic is incorporated in the resin formed by condensation of the cresol and condensation agent. This condensation reaction typically involves the formation of low molecular weight intermediates which initially form and then rearrange and combine with each other at a later stage.

Following reflux, excess water is removed from the condensate and the residue vacuum distilled to complete the condensation reaction, thereby removing excess monomer while gradually heating to a temperature ranging from 200 degrees C. to 300 degrees C. Finally, the resultant novolak resin is cooled to room temperature after being removed from the reactor.

The desired resist composition is then obtained by addition of a suitable sensitizer, the novolak resin preferably being in solution. Solvents suitable for this purpose include the alkanylenes such as acetone, methyl ethyl ketone and the like or esters and ethers such as methoxyethyl acetate and similar compounds.

Suitable photosensitizing agents may be selected from among the derivatives of compounds called "diazo oxides" or "orthoquinone diazides" as described in U.S. Pat. No. 3,402,044. The photosensitizer is employed in an amount ranging from 5–30 percent, by weight, based on the total solids in the resin.

The resultant photosensitized novolak composition may then be applied to a suitable substrate member by dipping, spraying, rolling or any other conventional manner. The coated substrate is then exposed to a light source through a mask to form an image in the photosensitive surface after development, the source of light being carbon-arc light, mercury vapor light, or any other light source having a wavelength ranging from 3000 to 5000 angstroms.

Photoresists described herein may be used as masks in the fabrication of thin film devices, or for the direct exposure of certain substrates, as for example, silicon integrated circuits and the like.

Examples of the application of the present invention are set forth below. It will be understood by those skilled in the art that these examples are for purposes of exposition only and are not to be construed as limiting.

EXAMPLE 1

A novolak resin was prepared by reacting 129.1 grams of m-cresol with 694.6 grams of o-cresol, and 180.9 grams of 2-tertiary butyl phenol with 711.8 grams of formalehyde in the presence of 18.1 grams of oxalic acid. The components were added to a reactor and under agitation brought to reflux temperature and refluxed for a period of approximately 18 hours. Following reflux, excess water was removed from the condensation product by decantation, and the condensate heated to a temperature of 220 degrees C. under vacuum distillation to complete the condensation reaction and remove unreacted monomers. The condensate was then removed from the reaction vessel and permitted to cool to room temperature.

A photoresist suitable for use as a maskant in the manufacture of thin film tantalum capacitors, was then prepared as follows.

152.9 grams of the novolak resin prepared as described above and 15.12 grams of 2,3-dibromopropyl napthoquinone-1,2-diazide-(2)-5-sulphonate were dissolved in a mixture of 180 grams of methoxyethyl acetate and 300 grams of methyl ethyl ketone. The solution was protected from light and filtered three times through a one-micrometer filter into a clean brown bottle. Following, the composition was spray-coated upon a beta-tantalum substrate to a thickness of 20 micrometers, prebaked at 90 degrees C., exposed through a mask for a 15-to-20-second time period through a 2500 watt Oriel light source, and developed with a standard, commercially available basic developer diluted with water to a ratio of 5:1 (water to developer). The clear areas of the pattern were then developed down to the substrate. This is in marked contrast to the more conventional situation wherein a commercially available photoresist is developed in accordance with the manufacturer's specification requiring two exposures of about 20 seconds each to clear the exposed area of the pattern.

On anodization of the beta-tantalum to 230 volts the resist was found to have a satisfactory pin-hole count and evidenced an edge breakdown slightly superior to that obtained with conventional resists.

Comparative exposures of this resist with known resists applied at a thickness of 6 microns showed that this resist could be exposed with 65 mj/cm$^2$ micrometers compared to 140 mj/cm$^2$ micrometers, or 190 mj/cm$^2$ micrometers for the known photoresists.

EXAMPLE 2

This example describes the preparation of a photoresist for direct exposure on silicon dioxide coated silicon wafers.

This end was attained by dissolving 5.4 grams of the sensitizer and 25.4 grams of the novolak resin of Example 1 in 87.6 grams of solvent consisting of 13.2 grams of cycohexanone and 74.4 grams of methoxyethyl acetate. The resist was protected from light and filtered through a 0.45 micrometer filter and kept in brown bottles. Following, the novolak resin was spun at 2900 revolutions per minute onto freshly oxidized silicon wafers and prebaked at 90 degrees C. The resist-coated wafer was then exposed through a chromium mask on a Perkin-Elmer projection printer for 35 seconds and developed using a 6:1 (water to developer) ratio, using standard, commercially available basic developer. This photoresist was faster or comparable with other integrated circuit photoresists.

EXAMPLE 3

This example describes the formulation of a photoresist as a maskant for gold plating. The novolak resin employed was prepared in accordance with the procedure described in Example 1, utilizing 1792.5 grams of orthocresol, 450 grams of 2-tertiary butyl phenol, 45 grams of oxalic acid and 2172 grams of 37.4% formaldehyde. 87.5 grams of the resultant novolak and 12.5 grams of the sensitizer of Example 1 were dissolved in a solvent consisting of 178 grams of methyl ethyl ketone and 107 grams of methoxyethyl acetate. The resultant photoresist was filtered three times through a one-micrometer filter and kept in brown bottles. The resultant resist was sprayed with a Zicon sprayer at a gun height of three inches with 26 psi nitrogen at a traverse speed of approximately 25 inches per second to yield 5-micrometer thick layers. After prebaking at 90 degrees C., it was exposed at 100 to 110 mj/cm$^2$ micrometers and developed with a standard developer of the basic variety, with a developer-to-water ratio of 1:4.

The resist so obtained did not require post baking prior to being used in the gold plating process. Conventional resists currently used for this purpose are exposed at 120 to 140 mj/cm$^2$ micrometers. The prime advantage of this resist is that it can be removed with mild solvents or acetone without leaving a residue of resist.

What is claimed is:

1. Method for the preparation of a positive photoresist which comprises the steps of
   (a) reacting at least one cresol with a condensation agent selected from the group consisting of aldehydes and reactive ketones, said condensation agent having less than 10 carbon atoms and at least one carbonyl group per molecule, and a hydroxylated aromatic of the general formula

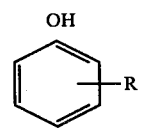

wherein R is an alkyl group having from 3–15 carbon atoms, said reaction being effected in the presence of a condensation catalyst,
   (b) heating the reaction mixture to reflux over a time period ranging from 12 to 24 hours,
   (c) subjecting the resultant mixture to vacuum distillation at a temperature ranging from 200–300 degrees C., and
   (d) adding a photosensitizing agent and a solvent to the resultant product.

2. Method in accordance with claim 1 wherein the cresol is employed in an amount ranging from 50–95 percent, by weight, based on the total hydroxylated aromatics present and said hydroxylated aromatic is employed in an amount ranging from 5–50 percent, by weight, based on the total hydroxylated aromatics present.

3. Method in accordance with claim 1 wherein the condensation agent is employed in an amount ranging from 0.95 to 1.35 of the stoichiometric amount.

4. Method in accordance with claim 3 wherein said hydroxylated aromatic is 2-tertiary butyl phenol and said condensation agent is formalehyde.

5. Method in accordance with claim 4 wherein the photosensitizing agent is 2,3-dibromopropyl naphthoquinone-1,2-diazide-(2)-5-sulfonate.

6. Method for forming a patterned resist on the surface of a substrate which comprises exposing a portion of the composition of claim 1 on said substrate to ultraviolet radiation having a wavelength with the range of 2000 to 5000 Angstroms for a time period sufficient to react the photosensitizer so as to solubilize the resist and selectively removing the exposed pattern from said substrate.

7. In a method for the preparation of a thin film device comprising the steps of anodizing portions of a layer of film forming metal deposited on an insulating substrate with other portions of the layer coated to prevent anodization thereof, the invention characterized in that the coating is the composition produced by claim 1.

8. The product of the method of claim 1.